(12) United States Patent
Hwang

(10) Patent No.: US 11,929,633 B2
(45) Date of Patent: Mar. 12, 2024

(54) CHARGING WAKE-UP CIRCUIT CAPABLE OF PROVIDING A CONTROL VOLTAGE TO WAKE UP A DEVICE WHEN BEING CHARGED

(71) Applicants: Inventec (Pudong) Technology Corp., Shanghai (CN); Inventec Corporation, Taipei (TW)

(72) Inventor: Bo-Han Hwang, Taipei (TW)

(73) Assignees: Inventec (Pudong) Technology Corp., Shanghai (CN); Inventec Corporation, Taipei (TW)

( * ) Notice: Subject to any disclaimer, the term of this patent is extended or adjusted under 35 U.S.C. 154(b) by 438 days.

(21) Appl. No.: 17/472,684

(22) Filed: Sep. 12, 2021

(65) Prior Publication Data

US 2022/0399735 A1 Dec. 15, 2022

(30) Foreign Application Priority Data

Jun. 10, 2021 (CN) .......................... 202110646858.5

(51) Int. Cl.
*H01M 10/46* (2006.01)
*B60L 58/10* (2019.01)
*G01R 19/165* (2006.01)
*H02J 7/00* (2006.01)
*H03K 17/687* (2006.01)

(52) U.S. Cl.
CPC .......... *H02J 7/00712* (2020.01); *B60L 58/10* (2019.02); *G01R 19/16538* (2013.01); *H02J 7/0029* (2013.01); *H03K 17/687* (2013.01)

(58) Field of Classification Search
CPC .... H02J 7/00712; H02J 7/0029; H02J 7/0048; H02J 7/0036; H02J 7/0069; B60L 3/0046; B60L 58/10; H03K 17/687; G01R 19/16538
USPC ........ 320/107, 116, 132, 135, 137, 148, 149
See application file for complete search history.

(56) References Cited

U.S. PATENT DOCUMENTS

2018/0253137 A1* 9/2018 Cho ...................... G06F 1/3212

FOREIGN PATENT DOCUMENTS

| CN | 218463502 U | * | 2/2023 | |
| WO | WO-2018076653 A1 | * | 5/2018 | ................ H02J 7/00 |

* cited by examiner

*Primary Examiner* — Edward Tso
(74) *Attorney, Agent, or Firm* — Winston Hsu

(57) ABSTRACT

A charging wake-up circuit includes a first switch, a second switch, a first resistor, a second resistor, and a third resistor. The first switch has a first terminal for receiving a first voltage, and a control terminal for receiving a second voltage. The second switch has a first terminal coupled to the second terminal of the first switch. The first resistor has a first terminal coupled to the control terminal of the second switch, and a second terminal coupled to the first terminal of the second switch. The second resistor has a first terminal coupled to the second end of the second switch, and a second terminal. The third resistor has a first terminal coupled to the second terminal of the second resistor and a device to provide a control voltage to the device to wake up the device, and a second terminal to receive a third voltage.

10 Claims, 2 Drawing Sheets

CHARGING WAKE-UP CIRCUIT CAPABLE OF PROVIDING A CONTROL VOLTAGE TO WAKE UP A DEVICE WHEN BEING CHARGED

BACKGROUND OF THE INVENTION

1. Field of the Invention

The application is related to a charging wake-up circuit, and more particularly, a charging wake-up circuit capable of providing a control voltage to wake up a device when being charged.

2. Description of the Prior Art

After being manufactured, electronic devices often need to be transported and stored before they are sold to users. Because the battery of an electronic product is not in use during transportation, after being produced, the battery should be set to a mode of lowest power consumption for saving power. This mode can be called a "shipping mode".

When a user wants to start using an electronic product, the user must perform a specific operation to make the electronic product leave the shipping mode. Usually, a dedicated input and output (I/O) pin must be installed in the control circuit of the electronic product, so the battery can be triggered to leave the shipping mode and enter a mode of normal operation by means of the dedicated I/O pin. The battery of the electronic device can be woken up by applying a specific voltage to the I/O pin or by contacting the I/O pin with a short-circuit operation.

In addition, for enabling the electronic product, these trigger operations often require specific procedures of the system. Therefore, it is not only necessary to install additional I/O pin(s) in the electronic product, which complicates the system, but also needs to specifically educate the users, which often causes inconvenience to the users.

SUMMARY OF THE INVENTION

An embodiment provides a charging wake-up circuit used to wake up a device. The charging wake-up circuit includes a first switch, a second switch, a first resistor, a second resistor and a third resistor. The first switch includes a first terminal used to receive a first voltage, a second terminal, and a control terminal used to receive a second voltage. The second switch includes a first terminal coupled to the second terminal of the first switch, a second terminal, and a control terminal. The first resistor includes a first terminal coupled to the control terminal of the second switch, and a second terminal coupled to the first terminal of the second switch. The second resistor includes a first terminal coupled to the second terminal of the second switch, and a second terminal. The third resistor includes a first terminal coupled to the second terminal of the second resistor and a first terminal of the device for providing a control voltage to the device, and a second terminal configured to receive a third voltage.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
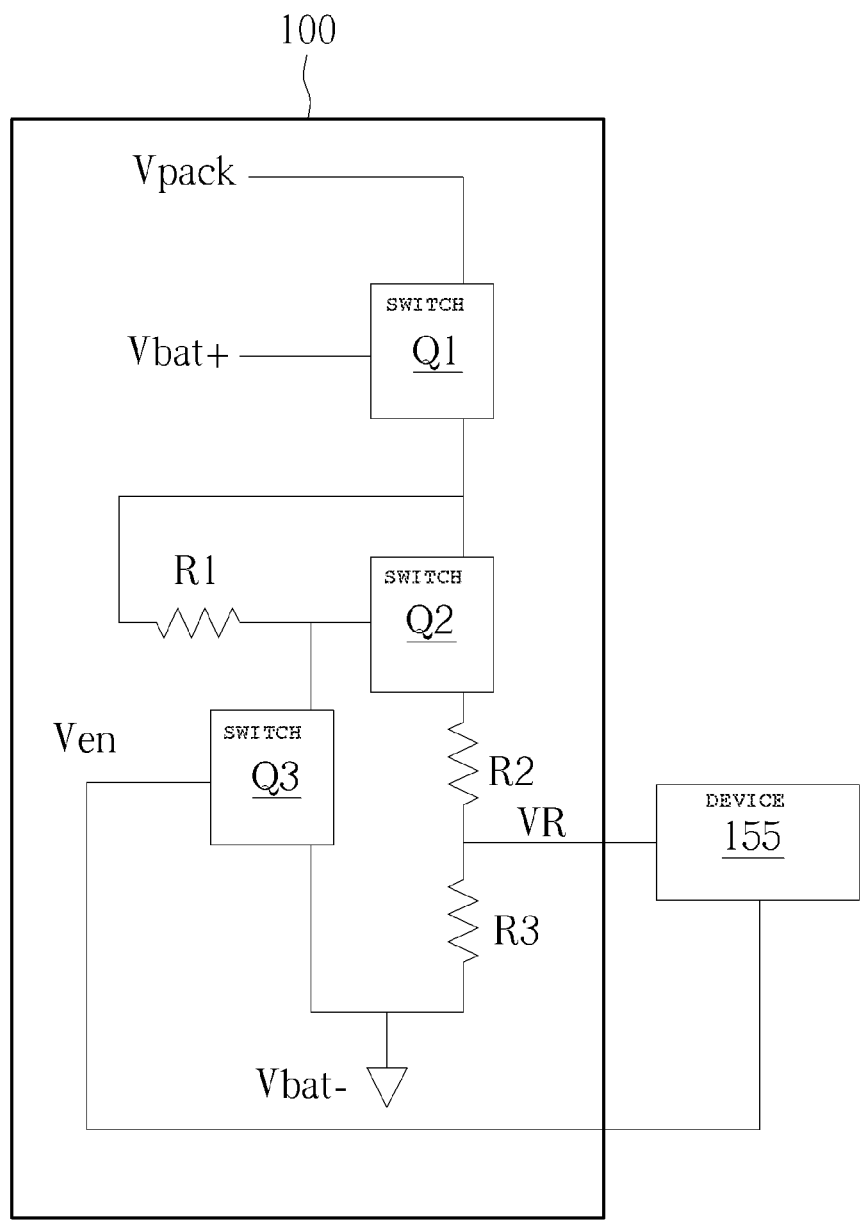
FIG. 1 illustrates a charging wake-up circuit coupled to a device according to an embodiment.

In order to reduce the complexity of the circuit and improve the convenience of use, a solution is provided according to embodiments as described below. FIG. 1 illustrates a charging wake-up circuit 100 coupled to a device 155 according to an embodiment. The charging wake-up circuit 100 can include a first switch Q1, a second switch Q2, a third switch Q3, a first resistor R1, a second resistor R2 and a third resistor R3. For example, the charging wake-up circuit 100 can be installed in a battery pack.

The charging wake-up circuit 100 is suitable for enabling the circuit of the battery module in a vehicle-mounted product, but it is not limited thereto.

The first switch Q1 includes a first terminal, a second terminal and a control terminal, where the first terminal is used to receive a first voltage Vpack, and a control terminal is used to receive a second voltage Vbat+. The second switch Q2 includes a first terminal, a second terminal and a control terminal, where the first terminal is coupled to the second terminal of the first switch Q1. The third switch Q3 includes a first terminal, a second terminal and a control terminal, where the first terminal is coupled to the control terminal of the second switch Q2, the second terminal is used to receive a third voltage Vbat−, and the control terminal is coupled to a second terminal of the device 155 to receive a fourth voltage Ven.

The first resistor R1 includes a first terminal and a second terminal, where the first terminal is coupled to the control terminal of the second switch Q2, and the second terminal is coupled to the first terminal of the second switch Q2. The second resistor R2 includes a first terminal and a second terminal, where the first terminal is coupled to the second terminal of the second switch Q2. The third resistor R3 includes a first terminal and a second terminal, where the first terminal is coupled to the second terminal of the second resistor R2 and a first terminal of the device 155 for providing a control voltage VR to the device 155, and the second terminal is used to receive the third voltage Vbat−.

Figure 2:
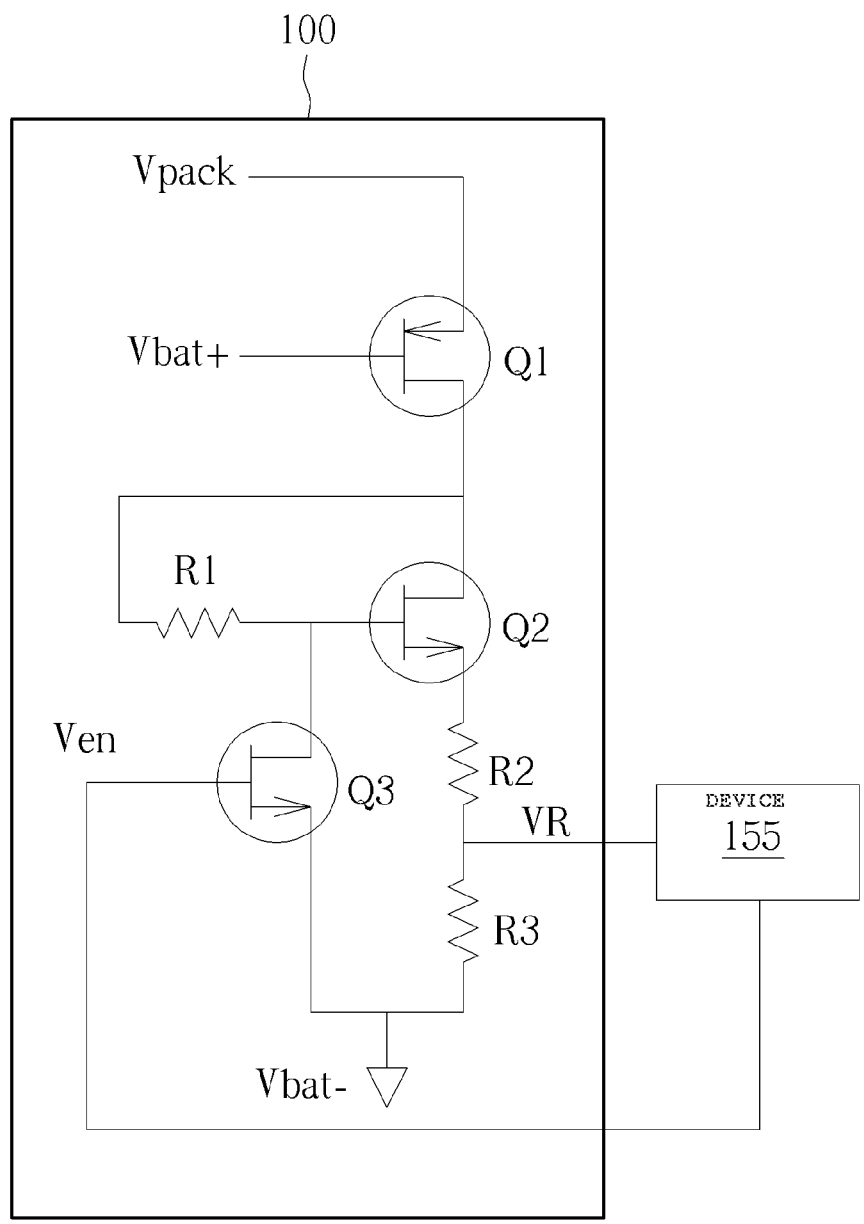
FIG. 2 illustrates the charging wake-up circuit of FIG. 1 coupled to the device according to an embodiment.

FIG. 2 illustrates the charging wake-up circuit 100 of FIG. 1 coupled to the device 155 according to another embodiment. As shown in FIG. 2, the first switch Q1 includes a p-type transistor, and the second switch Q2 and the third switch Q3 include n-type transistors. The first terminal of the first switch Q1 and the second terminals of the second switch Q2 and the third switch Q3 can be source terminals. The second terminal of the first switch Q1 and the first terminals of the second switch Q2 and the third switch Q3 can be drain terminals. The control terminals of the first switch Q1, the second switch Q2 and the third switch Q3 can be gate terminals.

According to an embodiment, the second voltage Vbat+ can be a positive electrode voltage of the battery, the third voltage Vbat− can be a negative electrode voltage of the battery, and the second voltage Vbat+ can be higher than the third voltage Vbat−.

According to an embodiment, the first voltage Vpack can be generated by transforming a mains power with a transformer. In other words, the first voltage Vpack can be from the transformer when the electronic device is being charged.

According to an embodiment, when the first voltage Vpack is higher than the second voltage Vbat+, the first switch Q1 and the second switch Q2 can be turned on, and the control voltage VR can be used to wake up the device 155 for the device 155 to enter a non-shipping mode from a shipping mode. For example, the non-shipping mode can include a normal mode, a sleep mode and so on. According to an embodiment, after entering the non-shipping mode, the device 155 does not return to the shipping mode.

As shown in FIG. 1, when the first voltage Vpack is higher than the second voltage Vbat+, the control voltage VR can be equal to a quotient of a product of the third resistor R3 and a difference between the first voltage Vpack and the third voltage Vbat−, and a sum of the second resistor R2 and the third resistor R3, as expressed by the equation eq-1:

$$VR=(Vpack-Vbat-)\times[R3/(R2+R3)] \quad \text{(eq-1)}$$

In other words, when the first voltage Vpack is higher than the second voltage Vbat+, the control voltage VR can be corresponding to a divided voltage obtained through the second resistor R2 and the third resistor R3. If the third voltage Vbat− is regarded as a zero voltage, the equation eq-1 can be $VR=Vpack\times[R3/(R2+R3)]$.

When the charging wake-up circuit 100 has not woken up the device 155 yet, the device 155 is still in the shipping mode. Since the battery has not been charged, the battery voltage (i.e. the second voltage Vbat+) is lower, and the first voltage Vpack is higher than the second voltage Vbat+. At this time, the external charger can provide a constant voltage (i.e. the first voltage Vpack) to supply power to the battery when there is no load. At this time, since the battery voltage is lower, the first switch Q1 can be turned on to generate the control voltage VR by using the external voltage, and the device 155 can be woken up with the control voltage VR.

After the device 155 has been woken up, the process of waking up the device 155 should be stopped. Hence, as shown in FIG. 1, the third switch Q3 can be used to decrease the control voltage VR after the device 155 has been woken up, as described below.

According to an embodiment, after the device 155 has been woken up, the device 155 can leave the shipping mode, and the device 155 can adjust the fourth voltage Ven to turn on the third switch Q3 and turn off the second switch Q2 to decrease the control voltage VR. Hence, after the device 155 has been woken up, the device 155 can leave the shipping mode without returning to the shipping mode.

For example, the device 155 can control the fourth voltage Ven to rise from a lower level to a higher level when the device 155 has been woken up. In this example, when the device 155 has been woken up, the fourth voltage Ven is at the high level, the third switch Q3 is turned on, so the control terminal of the second switch Q2 can receive the lower third voltage Vbat− to turn off the second switch Q2.

According to an embodiment, when the applied voltage increases, an optocoupler can be further used to isolate the charging wake-up circuit 100 from the power source of the main controller. The isolation can be achieved to comply with safety regulations.

Here, an example of the application scenario is provided for better understanding the technique of embodiments. After the device 155 has been produced, the battery level can be only 30% to 50%, and the activity in the battery is lower to ensure the safety of transportation. After the user purchases the device 155, the device 155 should be charged before being used for the first time. Generally, the device 155 should be charged for a predetermined time interval, such as eight hours. By charging the newly manufactured device 155 with a lower battery level, the abovementioned second voltage Vbat+ can gradually rise from a lower level to a higher level. During the time interval, as mentioned above, the device 155 can be woken up. After the device 155 has been woken up, the control voltage VR can be adjusted to stop the process of waking up the device 155. The abovementioned numerical values are only examples, and embodiments are not limited thereto.

According to an embodiment, the in-vehicle electronic products related to the invention can be applied to an in-vehicle device, such as a device in a self-driving car, an electric vehicle, or a semi-autonomous vehicle, etc.

In summary, by means of the charging wake-up circuit 100, the wake-up function can be performed though a necessary charging operation. Additional I/O pin is no longer required for receiving specific voltage or performing short-circuit contact to wake up the device 155. Hence, the complexity of circuit and the number of I/O pins are decreased. In addition, there is no need to perform complex specific procedures, so it has no need to educate consumers to perform complex wake-up operations, thereby improving the convenience of use. Moreover, the charging wake-up circuit 100 can also have sufficient isolation, so it can comply with safety regulations. Therefore, the long-standing problems in this field can be effectively solved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A charging wake-up circuit configured to wake up a device, the charging wake-up circuit comprising:
    a first switch comprising a first terminal configured to receive a first voltage, a second terminal, and a control terminal configured to receive a second voltage;
    a second switch comprising a first terminal coupled to the second terminal of the first switch, a second terminal, and a control terminal;
    a first resistor comprising a first terminal coupled to the control terminal of the second switch, and a second terminal coupled to the first terminal of the second switch;
    a second resistor comprising a first terminal coupled to the second terminal of the second switch, and a second terminal; and
    a third resistor comprising a first terminal coupled to the second terminal of the second resistor and a first terminal of the device for providing a control voltage to the device, and a second terminal configured to receive a third voltage.

2. The charging wake-up circuit of claim 1, wherein when the first voltage is higher than the second voltage, the first switch and the second switch are turned on, and the control voltage is used to wake up the device for the device to enter a non-shipping mode from a shipping mode.

3. The charging wake-up circuit of claim 2, wherein when the first voltage is higher than the second voltage, the control voltage is equal to a quotient of a product of the third resistor and a difference between the first voltage and the third voltage, and a sum of the second resistor and the third resistor.

4. The charging wake-up circuit of claim 1, further comprising:
    a third switch comprising a first terminal coupled to the control terminal of the second switch, a second terminal configured to receive the third voltage, and a control terminal coupled to a second terminal of the device to receive a fourth voltage.

5. The charging wake-up circuit of claim 4, wherein after the device has been woken up, the device adjusts the fourth voltage to turn on the third switch and turn off the second switch to decrease the control voltage.

6. The charging wake-up circuit of claim 4, wherein the first switch comprises a p-type transistor, and the second switch and the third switch comprise n-type transistors.

7. The charging wake-up circuit of claim 6, wherein:
the first terminal of the first switch and the second terminals of the second switch and the third switch are source terminals;
the second terminal of the first switch and the first terminals of the second switch and the third switch are drain terminals; and
the control terminals of the first switch, the second switch and the third switch are gate terminals.

8. The charging wake-up circuit of claim 4, wherein the fourth voltage rises from a lower level to a higher level when the device has been woken up.

9. The charging wake-up circuit of claim 1, wherein the second voltage is a positive electrode voltage of a battery, the third voltage is a negative electrode voltage of the battery, and the second voltage is higher than the third voltage.

10. The charging wake-up circuit of claim 1, wherein the first voltage is generated by transforming a mains power with a transformer.

\* \* \* \* \*